(12) United States Patent
Probst

(10) Patent No.: US 6,703,589 B1
(45) Date of Patent: Mar. 9, 2004

(54) DEVICE AND METHOD FOR TEMPERING AT LEAST ONE PROCESS GOOD

(75) Inventor: Volker Probst, Munich (DE)

(73) Assignee: Shell Solar GmbH, Munich (DE)

(*) Notice: Subject to any disclaimer, the term of this patent is extended or adjusted under 35 U.S.C. 154(b) by 23 days.

(21) Appl. No.: 10/111,282

(22) PCT Filed: Oct. 20, 2000

(86) PCT No.: PCT/DE00/03719

§ 371 (c)(1),
(2), (4) Date: Apr. 22, 2002

(87) PCT Pub. No.: WO01/29901

PCT Pub. Date: Apr. 26, 2001

(30) Foreign Application Priority Data

Oct. 26, 1999 (DE) .......................... 199 50 575

(51) Int. Cl.[7] .................................. F27B 5/14
(52) U.S. Cl. .................. 219/390; 219/405; 219/411; 392/416; 392/418; 118/224; 118/225; 118/501
(58) Field of Search ................. 219/390, 405, 219/411; 392/416, 418; 118/724, 725, 501

(56) References Cited

U.S. PATENT DOCUMENTS

| | | | |
|---|---|---|---|
| 5,578,503 A | * | 11/1996 | Karg et al. .......... 437/5 |
| 5,614,447 A | | 3/1997 | Yamaga et al. |
| 5,861,609 A | | 1/1999 | Kaltenbrunner et al. |
| 5,926,742 A | | 7/1999 | Thakur et al. |
| 5,998,767 A | | 12/1999 | Kersch et al. |

FOREIGN PATENT DOCUMENTS

| | | |
|---|---|---|
| DE | 29 32 918 | 2/1980 |
| DE | 195 44 525 A1 | 6/1996 |
| DE | 197 11 702 C1 | 6/1998 |
| EP | 61 129834 | 6/1986 |
| EP | 0 399 662 | 11/1990 |
| EP | 07 078830 | 3/1995 |
| EP | 0 662 247 | 7/1995 |
| EP | 0 926 719 | 6/1999 |
| EP | 0926719 | * 6/1999 |
| JP | 57-183041 A | 11/1982 |
| JP | 07078830 A | 3/1995 |
| WO | WO 94/07269 | 3/1994 |

OTHER PUBLICATIONS

F. Karg et al., "Novel Rapid–Thermal–Processing for CIS Thin–Film Solar Cells", Proceedings of the Photovoltaic Specialists Conference, May 10–14, 1993, vol. Conf.23, pp 441–446.

Takayuki Watanabe et al., "Solar Cells Based on $CuInS_2$ Thin Films through Sulfurization of Precursors Prepared by Reactive Sputtering with $H_2S$ Gas," Jpn. J. Appl. Phys., V. 35, 1996, pp. 1681–1684.

(List continued on next page.)

Primary Examiner—Shawntina Fuqua
(74) Attorney, Agent, or Firm—Young & Thompson (57) ABSTRACT

A method and for heat-treating at least one material being processed (3) under a specific process-gas atmosphere (111) of at least one process gas (4) with the aid of a heat-treatment unit (6). The heat-treatment unit has at least one energy source (5) for making the material being processed (3) take up an amount of energy, a heat-treatment container (11) with a heat-treatment space (16) for keeping the material being processed (3) under the process-gas atmosphere (111) during the heat treatment, a heat-treatment chamber (13), in which the heat-treatment container (11) is arranged at a distance (18) from the heat-treatment chamber (13), so that there is an intermediate space (14) between the heat-treatment container (11) and the heat-treatment chamber (13), and an element (19, 191) for producing in the intermediate space (14) a further gas atmosphere (141) of a further gas, different from the process-gas atmosphere (111).

13 Claims, 3 Drawing Sheets

OTHER PUBLICATIONS

J. Ermer et al., "Advances in Large Area CuInSe$_2$ Thin Film Modules," IEEE, 1990, pp. 595–599.

E. Niemi et al., "Small– and Large–Area CIGS Modules by Co–Evaporation," IEEE, 1996, pp. 801–804.

Nowshad Amin et al., "New Approaches on Thinner CdTe Thin–Film Solar Cells," 2nd World Conference and Exhibition on Photovoltaic Solar Energy Conversion, 1998, Vienna, Austria, pp. 1081–1084.

* cited by examiner

FIG 4

DEVICE AND METHOD FOR TEMPERING AT LEAST ONE PROCESS GOOD

BACKGROUND OF THE INVENTION

The invention relates to an apparatus for heat-treating at least one material being processed in a heat-treatment space of a heat-treatment container under a specific process-gas atmosphere of at least one process gas. An apparatus of this type is known for example from EP 0 662 247 B1. In addition to the apparatus, a method for heat-treating a material being processed is presented.

The material being processed known from EP 0 662 247 B1 is a multilayered element which is produced by applying a functional layer to a supporting layer (substrate). In order that the functional layer and/or the supporting layer have a desired physical (electrical, mechanical, etc.) and/or chemical property, processing of the material being processed or the layer and/or the supporting layer will be carried out. The processing comprises heat-treating the material being processed in the presence of a gas (process gas).

For the heat treatment, the material being processed is arranged in a closed heat-treatment container made of graphite. During the heat treatment, the material being processed is exposed to a process gas with gaseous selenium. During the heat treatment, the material being processed takes up an amount of energy, with a partial amount of the amount of energy being supplied to each layer. The heat treatment takes place, for example, at a heating-up rate of 10° C./s. A halogen lamp is used as the energy source of the amount of energy. With the halogen lamp, the heat-treatment container made of graphite is irradiated with an electromagnetic radiation, and consequently the heat-treatment container is heated up. Graphite has a high absorptivity for the electromagnetic radiation in the spectral range of the halogen lamp. The amount of energy absorbed by the graphite is supplied to the material being processed by heat radiation and/or heat conduction. The heat-treatment container consequently acts as a secondary energy source or as an energy transmitter.

Graphite has a high emissivity and a high thermal conductivity. When the material being processed lies on a base of the heat-treatment container, on an underside of the material being processed the amount of energy is supplied substantially by heat conduction. An upper side of the material being processed is supplied with an amount of energy by heat radiation, heat conduction and convection.

The larger the material being processed (the larger the surface area thereof), the more varied the materials used in the material being processed (for example greatly differing coefficient of thermal expansion, different absorptivity for the amount of energy etc.) and the higher a heat-treatment rate (heating-up rate, cooling-down rate), the more difficult it is to control a temperature homogeneity or temperature inhomogeneity in the material being processed. The temperature inhomogeneity may lead to mechanical stress in the material being processed, and consequently to destruction of the material being processed.

SUMMARY AND DESCRIPTION OF THE INVENTION

A problem which arises from the cited prior art is use of, or occurrence of, toxic and/or corrosive gases in heat treatment (for example $H_2Se$).

The object of the invention is to demonstrate how safe and reliable heat treatment can be carried out even in the presence of toxic and/or corrosive gases.

To achieve the object, an apparatus is specified for heat-treating at least one material being processed under a specific process-gas atmosphere of at least one process gas with the aid of a heat-treatment unit. The heat-treatment unit has at least one energy source for making the material being processed take up an amount of energy, a heat-treatment container with a heat-treatment space for keeping the material being processed under the process-gas atmosphere during the heat treatment, a heat-treatment chamber, in which the heat-treatment container is arranged at a distance from the heat-treatment chamber, so that there is an intermediate space between the heat-treatment container and the heat-treatment chamber, and a means for producing in the intermediate space a further gas atmosphere of a further gas, different from the process-gas atmosphere. The further gas atmosphere in this case has a pressure gradient.

The further gas atmosphere (which can be set) is distinguished, for example, by a defined partial pressure of a gas or gas mixture (for example air). It is also conceivable for the gas atmosphere to be a vacuum. The intermediate space helps to avoid process gas from being discharged into the surrounding area (atmosphere). For this purpose, in a special configuration, the intermediate space encloses the heat-treatment space.

The means for producing the further gas atmosphere is, for example, a gas cylinder, which is in connection with the intermediate space via one or more openings. A vacuum pump is also conceivable. With both means, a pressure gradient can be established in the intermediate space.

In a special configuration, the heat-treatment space and the intermediate space are connected to each other in such a way that a pressure gradient can be set between the heat-treatment space and the intermediate space.

In a further configuration of the invention, there is at least one heat-treatment unit, with an energy source for making the material being processed take up an amount of energy. The energy source is, for example, a flat bank of heaters, which is formed by a heater array. The heater array comprises, for example, bar-shaped halogen lamps or heating bars arranged parallel to one another. Each halogen lamp may in this case be arranged in a shroud for protection from exposure to the (corrosive) process gas or for easy assembly and disassembly. An energy source of this type sends electromagnetic radiation, in particular in the form of infrared radiation (thermal radiation, intensity maximum at a wavelength between 1 $\mu$m and 2 $\mu$m). An energy source in the form of a resistance heating element, which emits thermal radiation, is also conceivable. An element of this type has, for example, graphite, silicon carbide and/or a metal alloy such as nickel chromium. Additionally conceivable is any electromagnetic radiation (microwaves, UV light) which can lead to a heating-up of the material being processed. In addition, heat conduction and convection are also conceivable for the heat treatment. In a further configuration of the invention, the heat-treatment unit has at least one means for cooling the material being processed. This is accompanied by the advantage that a process sequence comprising various method stages, with at least one heating-up phase and cooling-down phase, can be carried out with the aid of the same apparatus. The means for cooling is, in particular, a cooling gas and/or a cooling liquid. The cooling takes place with the aid of the cooling gas by convection, with, for example, a cooling gas that is cooler in comparison with the material being processed being directed past the material being processed. The cooling may also take place by heat conduction, with the material being processed being in contact with a cooling element with a corresponding coefficient of thermal conductivity. It is conceivable for the cooling element to be an enclosure of the heat-treatment unit with a hollow space through which the cooling gas or the cooling liquid can be directed. In a further configuration, at least one of the energy sources is arranged in a shroud which is at least partially transparent to the electromagnetic radiation of the energy source. For example, the shroud consists of quartz glass. The shroud is preferably vacuum-tight. With the aid of the shroud, the energy source can be protected from contact with a process gas. Moreover, the shroud can be flowed through by a coolant, to accelerate cooling down of the energy source and consequently of the material being processed. A further advantage of this configuration is that the energy source can be easily exchanged.

In a special configuration, the shroud of the energy source has an optical filter for the electromagnetic radiation of the energy source. In this way, the optical property (absorptivity and transmissivity) of the shroud can be influenced in a specifically selective way.

In a special configuration, at least one of the heat-treatment units has at least one transparent element, which has a specific absorption and a specific transmission for at least one of the electromagnetic radiations and which is arranged in the radiation field of the electromagnetic radiation between the energy source of the electromagnetic radiation and one of the materials being processed. The special advantage of the transparent element, in particular when heat-treating a multilayered element, is presented further below in connection with the configuration of the heat-treatment unit.

In a special configuration, the shroud of the energy source, the heat-treatment container, the heat-treatment chamber, the transparent element and/or a reflective element have a material which is inert with respect to the gas. In particular, the material is selected from the group comprising glass, quartz glass, fused quartz, ceramic, glass ceramic and/or metal. These materials are inert, i.e. unreactive, with respect to a large number of process gases. Moreover, some materials, such as quartz glass or glass ceramic, have a low coefficient of thermal expansion. This is particularly important in the case of an apparatus which is made up of component parts of various materials. Within a permissible tolerance, one dimension of a component part can change. This ensures that the apparatus is not destroyed during the heat treatment on account of mechanical stress, i.e. is preserved. What is more, it makes it more easily possible to keep a check on a gas atmosphere. A possible gap of a component part or between the component parts of the apparatus scarcely changes during the heat treatment as a result of the low coefficient of thermal expansion of its component parts. An additional advantage results from use of a machinable material (for example machinable ceramic, glass ceramic or machinable fused quartz).

It is described below how it is ensured by various configurations of the heat-treatment unit that materials being processed of a large surface area, in particular multilayer bodies with an unsymmetrical sequence of layers, can be heat-treated while controlling a temperature homogeneity of the material being processed.

The material being processed of the heat-treatment unit is, for example, a multilayered element which has a first layer and at least one second layer. The heat treatment takes place by an amount of energy being taken up by the multilayered element, with a first partial amount of the amount of energy being taken up by the first layer and a second partial amount of the amount of energy being taken up by the second layer. The heat-treatment unit, which has at least one energy source of the amount of energy, is characterized in that the first layer is arranged between a first energy source and the second layer and the second layer is arranged between a second energy source and the first layer. At least one of the energy sources has an emission of a specific electromagnetic radiation with a radiation field, and at least one of the layers has a specific absorption for this electromagnetic radiation and is arranged in the radiation field. In addition, at least one transparent element, which has a specific transmission and a specific absorption for the electromagnetic radiation, is arranged in the radiation field between the energy source with the radiation field and the layer which has the absorption of the electromagnetic radiation and is arranged in the radiation field.

The transparent element helps to heat up the layers of the multilayered element individually, i.e. to control, regulate and/or preset in a specifically selective way the partial amount of the amount of energy which the layer takes up. For example, an amount of energy is determined during the heat treatment with the aid of a control loop (see below). It is also conceivable for a presetting of the energy sources (for example energy density, type of energy, etc.) to be sufficient without an additional control loop. Individual heating-up of the layers of the multilayered element is possible even in the case of very high heating-up rates of from 1° C./s to, for example, 100° C./s and more. The individual heating-up succeeds in keeping a mechanical stresses and a deformation of the multilayered element thereby caused under certain circumstances as small as possible during the heat treatment.

The basis for this is the transparent element, which is optically partially transmitting (semitransparent). The transmission, which for a specific wavelength lies between 0.1 and 0.9, for example, allows the electromagnetic radiation described above to pass through the transparent element onto a layer. The layer can take up a corresponding amount of energy or partial amount of the amount of energy which is directly emitted by the energy source. The transparent element also has a certain absorption for the electromagnetic radiation. The energy which is thereby taken up may be emitted to a surrounding area in the form of heat radiation and/or heat conduction. In a special configuration, the apparatus for heat-treating a multilayered element has a transparent element which radiates and/or conducts heat in the direction of the multilayered element through the absorption of the electromagnetic radiation. In this way it is possible to heat-treat a layer by heat radiation and/or heat conduction.

It is also conceivable for a first layer of the multilayered element, which transmits the heat radiation, to be heat-treated substantially only by heat conduction, while a second layer of the same multilayered element is heat-treated substantially by the heat radiation from the same transparent element. A first layer with a corresponding transmission is, for example, a layer of glass. If electromagnetic radiation of an energy source and/or a transparent element comes into contact with the glass element, a small proportion of the radiation (approximately 4%) is reflected. Most of the radiation (>90%) passes through the glass more or less unhindered and then impinges on a second layer of the multilayered element. This radiation can be absorbed there and leads to an amount of energy being taken up by the second layer. The glass layer cannot be heat-treated sufficiently quickly by radiation or heat radiation at a very high heating-up rate. By contrast, relatively quick heat treatment can be achieved by heat conduction if the transparent element is able to take up a partial amount of the amount of energy and transmit it to the glass layer.

The case in which the transparent element itself is a layer of the multilayered element is also conceivable. The transparent element can take up a partial amount of the amount of energy through absorption of part of the electromagnetic radiation and can pass on a further partial amount of the amount of energy by transmission, for take-up by a further layer.

In a special configuration of the heat-treatment unit, one layer of the multilayered element is a supporting layer for at least one further layer of the multilayered element. The multilayered element has, in particular, an unsymmetrical sequence of layers. For example, the multilayered element comprises a supporting layer which is coated on one side. Individual layers of the multilayered element may also be arranged next to one another.

In a special configuration, one layer of the multilayered element has a material which is selected from the group comprising glass, glass ceramic, ceramic, metal and/or plastic. Temperature-resistant plastic, such as Teflon, comes into consideration in particular as the plastic. One layer is, for example, a metal foil. The metal foil may also act as a supporting layer.

The partial amount of the amount of energy which is taken up by a layer depends, for example, on the absorptivity, emissivity and/or reflectivity of the layer. It also depends, however, on the type of energy source and on the way in which the amount of energy is transmitted to the multilayered element or to a layer of the multilayered element.

One of the energy sources of the heat-treatment unit is, for example, an energy source of thermal energy. The layer may be supplied with the thermal energy directly. Heat radiation, heat conduction and/or convection come into consideration here. In the case of heat radiation, the energy source may itself be a source of heat radiation. The heat radiation is, for example, electromagnetic radiation in the wavelength range between 0.7 and 4.5 $\mu$m. The corresponding layer is arranged in the radiation field of the energy source. The layer is impinged by the electromagnetic radiation of the energy source and at least partially absorbs the electromagnetic radiation.

It is also possible, however, for a layer to be supplied with any desired energy, which is converted into thermal energy in the layer. For example, a layer is irradiated with high-energy UV light, which the layer absorbs. Absorption of a high-energy light quantum causes a molecule of the layer or the entire layer to become electronically excited. Energy which is thereby taken up can be converted into thermal energy.

In addition to heat radiation and heat conduction, it is also possible for a layer or the entire element to be heat-treated by convection. In this case, a gas with a specific energy is directed past the layer, with the gas releasing the energy to the layer. Gas directed past may at the same time act as process gas.

Moreover, a layer can also be cooled by heat conduction and/or convection. In this case, negative thermal energy is supplied to the layer. In this way, it is also possible to control the amounts of energy or the partial amounts of the amounts of energy and, for example, additionally influence the mechanical stresses in the multilayered element.

In a special configuration, there is an energy transmitter for the transmission of the amount of energy to the multilayered element. The energy transmitter acts as a secondary energy source. The energy transmitter absorbs, for example, electromagnetic radiation of a primary energy source, for example a halogen lamp, from a higher energy band and converts this electromagnetic radiation into heat radiation, which is absorbed by the layer. The indirect and/or direct surronding area of the multilayered element may act as the energy transmitter during the heat treatment. It is conceivable for an energy transmitter to be arranged with the multilayered element for heat treatment in an interior space of a heat-treatment container. The energy transmitter may also be arranged outside the container, for example on a wall of the heat-treatment container or at a distance from the heat-treatment container. It is conceivable for the energy transmitter to be a coating of the heat-treatment container. The energy transmitter is, for example, a graphite film. It is even possible for the heat-treatment container itself to assume the function of an energy transmitter. A function of this type is provided, for example, in the case of a heat-treatment container made of graphite. Finally, the transparent element is nothing other than an energy transmitter. Similarly, in the case of energy transmission by convection, a gas acts as an energy transmitter.

An amount of energy which is taken up by the multilayered element may differ not only from layer to layer but also within a layer. For example, during the heat treatment, an edge effect occurs in the multilayered element or in a layer of a multilayered element. An edge region of the layer is at a different temperature than an inner region of the layer. A lateral temperature gradient is established during the heat treatment. This takes place, for example, whenever a radiation field of the energy source is inhomogeneous. In this case, an energy density of the radiation field on a surface area to which the radiation is radiated is not identical everywhere. A lateral temperature inhomogeneity may also be established when the radiation field is homogeneous, if a greater amount of energy per unit volume is absorbed on account of the larger absorbing area per unit volume. To compensate for the temperature gradient, it is possible, for example, to use an energy source which comprises a multiplicity of subunits. Each subunit may be actuated separately, and in this way each amount of energy supplied from a subunit to a layer can be set separately. An example of an energy source of this type is an array or matrix of individual heating elements. An example of a heating element is a halogen lamp. The array or matrix can also be used to establish a lateral temperature gradient in the layer. In this way, it would be possible, for example, to produce permanent or transient deformation of the layered element in a specifically selective way. An array or matrix is of great advantage in particular for the heat treatment of a multilayered element in which layers lie next to one another.

With respect to the energy source, it is advantageous if the energy source or the energy sources operate in a continuous mode. It is also conceivable, however, for the energy sources to make the amount of energy or the partial amounts of the amount of energy available to the layers in a cyclical and/or pulsed mode. An energy source of this type is, for example, an energy source with pulsed electromagnetic radiation. In this way, an amount of energy can be supplied to the layers at the same time or within a temporal sequence (for example alternately).

The following properties of the energy source of electromagnetic radiation are particularly advantageous:

- The energy source has a homogeneous radiation field.
- A spectral intensity distribution of the energy source partially overlaps a spectral absorption of the layer, of the transparent element and/or of any heat-treatment container that may be present (see below).
- The energy source is corrosion-resistant and/or corrosion-protected in the presence of a process gas.

The energy source has a high energy density, which is sufficient to allow a mass of the multilayered element (and, if appropriate, that of a heat-treatment container) to be heated up at a heating-up rate of over 1° C./s.

In a special configuration, the transparent element of the apparatus has at least one spacer, against which the multilayered element bears in order for a laterally homogeneous amount of energy to be taken up by the multilayered element. For example, the layer by means of which the multilayered element rests on the transparent element or the spacer is primarily heat-treated by homogeneous heat radiation. In this form, the spacer preferably has a material which has a low absorption for the electromagnetic radiation. A spacer projects, for example, beyond a surface of the transparent element by a few µm to mm.

The layer resting on the spacers may also be primarily heat-treated by heat conduction. For this purpose, the spacers have, for example, a thermal conductivity which is necessary to achieve a corresponding heat-treatment rate. For energy transmission by heat conduction, it is also conceivable for the spacer to have a high absorption for an electromagnetic radiation of an energy source, with the electromagnetic radiation being additionally converted into thermal energy.

In particular, the transparent element has a multiplicity of spacers. With a multiplicity of spacers which are arranged uniformly and in contact between the layer of the multilayered element and the transparent element, it is additionally possible to achieve homogenization of the lateral temperature distribution.

In a special configuration, the transparent element and/or the spacer has a material which is selected from the group comprising glass and/or glass ceramic. Glass ceramic has various advantages:

It can be used for heat treatment in a wide temperature range from, for example, 0° C. to, for example, 700° C. Glass ceramic has, for example, a softening point which lies above the temperature range.

It has a very low coefficient of thermal expansion. It is resistant to thermal shocks and is free of distortion in the abovementioned temperature range of heat treatment.

It is chemically inert with respect to a large number of chemicals and has low permeability for these chemicals. A chemical of this type is, for example, the process gas to which a layer or the entire multilayered element is exposed during the heat treatment.

It is optically partially transmissive in the spectral range of many energy sources for electromagnetic radiation, in particular in a wavelength range in which a radiation density of the energy sources is high. A radiation source of this type is, for example, a halogen lamp with a high radiation density of between 0.1 and 4.5 µm.

Glass, in particular quartz glass, are likewise conceivable as a material for the transparent element. The advantage of glass is that it can be used at high temperatures of up to 1200° C. These materials exhibit a high transmission and low absorption in the spectral range of an energy source in the form of a halogen lamp. The light passes through the transparent element substantially unhindered and reaches a layer with a corresponding absorption for the electromagnetic radiation, the layer taking up an amount of energy and being heated. The transparent element is scarcely heated by the radiation.

In one process application it is possible for material of the heated layer to evaporate and be deposited on a relatively cold surface of the transparent element. To prevent this, it is possible to ensure that the transparent element is heated to a necessary temperature during the heat treatment. This is achieved by transmitting an amount of energy to the transparent element by heat conduction and/or convection. Electromagnetic radiation which the transparent element absorbs is also conceivable. It is conceivable for the transparent element to have a coating which absorbs a certain part of the electromagnetic radiation. The energy taken up as a result can be passed on to the transparent element made of glass or quartz glass. In this form, the transparent element, comprising the glass element with the coating, is optically partially transmissive and can be used to transmit energy to the multilayered element both by heat radiation and by heat conduction.

In a special configuration, at least one layer of the multilayered element is in contact with a process gas. It is also conceivable for the entire multilayered element to be exposed to the process gas. An inert gas (molecular nitrogen or noble gas) comes into consideration for example as the process gas. The process gas does not react with a material of the layer. However, a process gas which does react with a material of the layer is also conceivable. Under the action of the process gases, the functional layer forms. For example, the process gas has an oxidizing or reducing effect on a material of the layer. Possible process gases for this are oxygen, chlorine, hydrogen, elemental selenium, sulfur or a hydride. It may also be an etching process gases such as HCL or the like. Further examples of the process gas are $H_2S$ and $H_2Se$, which are used in the production of a thin-film solar cell (see below). Finally, all gases or gas mixtures which react with a material of a layer in a corresponding way are conceivable. It is advantageous if the layer is exposed to a defined process-gas atmosphere. The defined process-gas atmosphere comprises, for example, a partial pressure of the process gas or gases during the heat treatment. It is also conceivable, for example, for a layer or the multilayered element to be in contact with a vacuum for heat treatment.

A defined process,-gas atmosphere can be achieved, for example, by directing the process gas past the layer at a specific velocity. In this case, a process gas with various partial pressures can act on the layer in the course of the heat treatment. It is also conceivable for various process gases to be successively in contact with the layer of the layered element.

Preferably, at least the layer which is in contact with the process gas is enclosed. This is achieved, for example, by sheathing the layer, it being possible for the sheathing to be secured to the supporting layer. The sheathing is filled with the process gas before or during the heat treatment. The process gas is in this case concentrated on a surface of the layer of which the properties are to be influenced by the process gas.

In this way it is possible to prevent a surrounding area from being contaminated by the process gas. This is important in particular when using a corrosive and/or toxic process gas. Furthermore, it is possible to operate with a stoichiometric amount of process gas necessary for conversion of the layer. There is no unnecessary consumption of process gas.

In a special configuration of the invention, the multilayered element is arranged in a heat-treatment container. In this case, at least one container wall of the heat-treatment container has a transparent element. The heat-treatment container has the advantage that it automatically forms the sheathing of the layer or the entire multilayered element. The sheathing does not need to be secured to the multilayered element. In the case of a closable heat-treatment container, the process-gas atmosphere can be set in a specifically selective and easy way. For example, the heat-treatment container offers a sufficiently large volume for the process gas required during the heat treatment. If the heat treatment requires a homogeneous and reproducible distribution of the process gas over a layer, a gas discharge from the heat-treatment container can also be set in a specifically selective way. This may be necessary, for example, whenever the heat treatment is carried out at a very high heating-up rate. In this case, the process gas expands. If the heat-treatment container does not withstand the gas pressure thereby occurring, the heat-treatment container is deformed or even destroyed. However, deformation should be prevented, for example, if the multilayered element rests on the base of the heat-treatment container. Deformation of the heat-treatment container may lead to a lateral temperature inhomogeneity in the multilayered element.

Moreover, the heat-treatment container may be a means for transporting the multilayered element during heat treatment. The heat-treatment container has the advantage that it is not possible, for example, to rule out the possibility of a layer (supporting layer or substrate) of glass breaking during the heat treatment. In the event of such a substrate breaking, the broken material can be easily removed from the heat-treatment units or from the apparatus for heat treatment. This contributes to stabilizing the heat-treatment process.

In a particular configuration, the container wall of the heat-treatment container which has the transparent element is a cover and/or a base of the heat-treatment container. For example, one layer of the multilayered element rests directly on the transparent element of the base. As described above, the transparent element may have spacers. The cover likewise has the transparent element, which, for example, is not in contact with the multilayered element or a layer of the multilayered element. In this way, the layer of the multilayered element which rests on the base can be heated by heat conduction, the layer facing the cover can be heated by heat radiation. The layer facing the cover can easily be exposed to a process gas.

In a further configuration, the base and/or the cover of the heat-treatment container is formed by in each case at least one multilayered element. In this case, the layer of the multilayered element which, for example, is intended to come into contact with a process gas is directed into the interior space of the heat-treatment container. This solution is possible if the multilayered element or the layers of the multilayered element have a low coefficient of thermal expansion and/or the heat-treatment rate is low. For a high heat-treatment rate, the multilayered element advantageously has a supporting layer with a high coefficient of thermal conductivity. The supporting layer is directed outward. For example, here the supporting layer is a transparent element as described above.

In a special configuration, the heat-treatment container, the transparent element and/or the energy transmitter have a material which is inert with respect to a process gas. Moreover, it is advantageous for an entire heat-treatment process area to be inert with respect to the process gas used. The process area also includes, for example, the energy source (primary energy source).

The material is selected according to the process gas. Glass, glass ceramic and ceramic are conceivable, for example. A fiber-reinforced material, such as carbon-fiber-reinforced graphite can similarly be used. A material such as SiC, which has a high coefficient of thermal conductivity, is also conceivable. The heat-treatment container may consist of a metal or an alloy. A plastic which is resistant up to a specific temperature is similarly possible.

In addition to being chemically inert with respect to the process gas, the following properties are of advantage for the material of the heat-treatment container:

The material of the heat-treatment container is free from distortion under the heat-treatment conditions. It is also resistant to temperature shocks. This is the case in particular whenever it has a low coefficient of thermal expansion.

The thermal softening point of the material of the heat-treatment container lies above a maximum temperature of the heat treatment.

The heat-treatment container exhibits a low or defined permeability with respect to a process gas.

In a special configuration, there is a device for detecting a dimension of at least one physical parameter of the apparatus and/or a heat-treatment unit that is dependent on the heat treatment, for controlling the first and second partial amounts of the amount of energy.

One conceivable parameter is an absorption, transmission and/or reflection property of a layer. The dimension of the parameter is the value of the parameter. For example, a wavelength of a maximum absorption may depend on the temperature. The dimension of the parameter would in this case be the corresponding wavelength.

In particular, the parameter is a temperature of the multilayered element. In this case, the dimension is a value of the temperature. The detection of the temperature of a layer of the multilayered element, of the transparent element and/or of the heat-treatment container or a wall of the heat-treatment container is also conceivable. During the heat treatment, it is always possible for at least one parameter of the multilayered element and/or of a layer to be detected. For example, the partial amount of the amount of energy which is taken up by the layer is increased or decreased on the basis of the detected temperature of a layer. In this way, a temperature inhomogeneity or a temperature gradient in the direction of the thickness of the multilayered element can be avoided. This temperature inhomogeneity can, however, also be increased, should this be necessary.

For example, the device for detecting the temperature is be a pyrometer, which is directed at the layer. The pyrometer detects, for example, the heat radiation which is emitted by the layer. The temperature of the layer can be concluded on the basis of the heat radiation. A temperature detector which is connected to the layer and the temperature of which is controlled by heat conduction is also conceivable.

It is also conceivable for the temperature of the layer or of the multilayered element not to be measured directly but indirectly. For example, a pyrometer is directed at the heat-treatment container in which the multilayered element is heat-treated. The temperature of the heat-treatment container may be influenced by the temperature of the multilayered element. The temperature of the layer of the multilayered element is concluded on the basis of the temperature of the heat-treatment container. The amount of energy or the partial amount of the amount of energy is controlled on the basis of the measured temperature of the heat-treatment container. For this purpose, for example, a kind of "calibration measurement" is to be carried out prior to the heat treatment, representing a relationship between the measured temperature of the heat-treatment container and the actual temperature of the layer or of the layered element. The "calibration measurement" indicates a desired value of the temperature. The actual value is detected. A comparison between the desired value and the actual value supplies a controlled variable for controlling the amounts of energy. The detection (and also the control of the partial amounts of the amount of energy) takes place in particular with a local resolution in the direction of the thickness of the multilayered element and with a temporal resolution within the time frame of the heat treatment. For example, the multilayered element is heated up at a heat-treating rate of 25° C./s. In that case, both the detection and the control of the partial amounts of the amount of energy would take place so quickly that a temperature difference between the layers of the multilayered element during the heat treatment remains below a prescribed maximum, for example.

The temperature inhomogeneity in the direction of the thickness may, in combination with a transient deformation of the multilayered element, also lead to a lateral temperature inhomogeneity in the multilayered element. Lateral means, for example, within a layer of the multilayered element perpendicular to the direction of the thickness. For example, the multilayered element rests on a base of graphite. The supply or take-up of the amount of energy by the layer of the multilayered element resting on the base takes place through heat conduction. A temperature inhomogeneity in the direction of the thickness may cause a transient deformation of the multilayered element in the form of bending of the multilayered element. In this case, the contact between the multilayered element and the base of the heat-treatment container that is necessary for the heat conduction is partially detached. As a consequence of this, there is a lateral temperature inhomogeneity of the resting layer or of the multilayered element. It is therefore particularly advantageous if, for the detection of the parameter (and control of the amounts of energy), there is a local resolution not only in the direction of the thickness but also laterally.

In a special configuration, the parameter is a deformation of the multilayered element. The occurrence of a temperature inhomogeneity may cause deformation. For example, the multilayered element is concavely curved. The multilayered element rests on the base of, for example, a heat-treatment container. Concave deformation has the effect that a distance between the resting surface and the multilayered element forms in the edge region of the multilayered element. A laser interferometry or laser light reflection device can be used, for example, to detect a dimension of such a deformation. The control of the amounts of energy takes place on the basis of the dimension. It is advantageous if the dimension is detected in an early stage of the deformation and it is possible to react quickly to it.

For an abovementioned device for detecting a dimension of a parameter which is dependent on the heat treatment with the aid of an optical device (for example a laser), it is advantageous if the layer which is to be examined is accessible for light from the optical device and a detection signal can be unequivocally assigned to the parameter to be detected. The wavelength of a laser should, for example, differ sufficiently from the heat radiation of the multilayered element. If the apparatus is equipped with a heat-treatment container, it would be advantageous if the transparent element is sufficiently transparent to the light of the laser.

With the aid of the apparatus, it is also possible to achieve a desired deformation of the multilayered element. For this purpose, it may also be appropriate to monitor the deformation during the heat treatment in the manner described above. For example, it is possible to produce a curved thin-film solar cell. To achieve specifically selective deformation, the multilayered element is, for example, laid on a corresponding mold or mask. The mold or mask may directly be an energy source. The multilayered element is heated to above a softening point of the supporting layer. As a consequence of this, the multilayered element adopts a shape which corresponds to that of the mask or mold. The mask is, for example, integrated in a base of the heat-treatment container. The mask could be, for example, the transparent element. To achieve the object, in addition to the apparatus there is specified a method for heat-treating a material being processed under a specific process-gas atmosphere of a process gas, with the aid with the method steps: a) arranging the material being processed in the heat-treatment space of the heat-treatment container and b) heat-treating the material being processed while establishing the pressure gradient of the further gas atmosphere in the intermediate space between the heat-treatment container and the heat-treatment chamber.

The intermediate space with the further gas, for example a purging gas, acts as a buffer, so that the process gas which is located in the heat-treatment space cannot reach the heat-treatment chamber, or only in a rarefied form. Contamination or corrosion of the heat-treatment chamber can be prevented. The selection of the material of the heat-treatment chamber is virtually independent of the process gas. The intermediate space can be filled once with the purging gas. It is also conceivable for a continuous stream of purging gas to be passed through the intermediate space, removing from the intermediate space process gas possibly escaping from the heat-treatment container. The stream of purging gas is produced by the pressure gradient. A removal of escaping process gas is also achieved by a pressure gradient being established from the heat-treatment space of the heat-treatment container to the intermediate space.

In a special configuration, a gas pressure of the heat-treatment space and/or a gas pressure of the intermediate space and/or a gas pressure of the buffer space is set. In particular, a gas pressure of the heat-treatment space which is less than the gas pressure of the intermediate space is chosen for establishing the pressure gradient. In addition, it is also conceivable in particular for a gas pressure of the buffer space that is less than the gas pressure of the heat-treatment space and/or less than the gas pressure of the intermediate space to be chosen. In this way, a pressure gradient can be set between the heat-treatment space and the intermediate space. This is achieved in particular by the heat-treatment chamber being arranged in a shroud.

In a further configuration, the heat treatment comprises at least one heating-up and/or at least one cooling-down process. In this case, it is possible in particular to run through a plurality of heating-up and cooling-down phases.

According to a further configuration, a multilayered element with a layer and at least one further layer is used as the material being processed.

In this case, a multilayered element with a layer which has copper, indium, gallium and/or selenium is used in particular. A supporting layer of the multilayered element is made in particular of glass and/or metal.

In a special configuration, a process gas which is selected from the group comprising $H_2S$, $H_2Se$, $H_2$, He and/or $N_2$ is selected.

In particular, a further gas, which is selected from the group comprising $N_2$ and/or noble gas, is used.

The method is suitable in particular for producing a photovoltaic thin-film chalcopyrite absorber of a solar cell and/or of a solar module.

The process-gas atmosphere and the further gas atmosphere may be produced before, during or after the heat treatment. The materials being processed can in this case be brought simultaneously into contact with a plurality of process gases (gas mixture). It is also conceivable for the material being processed to be brought successively into contact with different process gases and/or purging gases. Consequently, a variable process gas profile (temporal sequence of different partial pressures of the process gas or gases) is possible. In this way, it is possible, for example, to use both oxidizing and reducing process gases, or to introduce a dopant into the material being processed in a specifically selective way.

In a special configuration, there is a shroud of the heat-treatment container, so that there is a buffer space for gas between the intermediate space and the heat-treatment space.

In the intermediate space between the heat-treatment chamber and the heat-treatment container, a gas pressure of a purging gas that is greater than the gas pressure in the buffer space is produced. For this purpose, gas outlet openings are preferably provided in the shroud, led to the outside for example via a manifold pipeline through the intermediate space and through the heat-treatment chamber, and directed there for example into a gas disposal unit. Consequently, the pressure prevailing in the buffer space of the shroud is approximately the same as that in the gas disposal unit (for example atmospheric pressure). The effect of this arrangement can be referred to as gap counterflow purging, which serves the purpose of opposing the stream of process gas diffusing out of the heat-treatment space with a counteracting stream of inert gas at a gap of a lead-through in the shroud, for example at an assembly gap of a component of the shroud, with the aim of preventing condensation of process gases on the walls of the heat-treatment chamber or corrosion of the walls of the heat-treatment chamber. The latter can also be achieved, moreover, by suitable coating of the walls of the heat-treatment chamber.

The gap counterflow purging works on the following principle: the heat-treatment container filled with the process gas is arranged in the shroud. It is not possible to rule out the possibility of the process gas getting into the buffer space of the shroud.

The buffer space of the shroud and the intermediate space between the heat-treatment container and the heat-treatment chamber are connected by gaps or openings. A pressure gradient from the intermediate space to the buffer space is built up as a result of the choice of the gas pressures. This is achieved, for example, by extracting the purging gas from the buffer space by suction and/or introducing the purging gas into the intermediate space and a resultant pressure build-up with respect to the pressure of the buffer space, which may, as described above, be in contact with the surrounding area of the heat-treatment apparatus. This produces a stream of purging gas from the intermediate space to the buffer space. The process gas does not reach the chamber wall of the heat-treatment chamber. In this way, a temperature of the heat-treatment chamber, the gas pressure of the buffer space and/or the gas pressure of the intermediate space are set in particular during the heat treatment.

In a special configuration, a multilayered element with a layer and at least one further layer is used as the material being processed and/or further material being processed.

In this case, the heat treatment takes place by an amount of energy being taken up by the multilayered element, with a first partial amount of the amount of energy being taken up by the first layer and a second partial amount of the amount of energy being taken up by the second layer, with at least one energy source being used for supplying the amount of energy to the multilayered element. In this case, an apparatus described above is used in particular. The method steps are: arranging the multilayered element between a first and at least one second energy source, so that the first layer is arranged between the first energy source and the second layer and the second layer is arranged between the second energy source and the first layer, with at least one energy source of a specific electromagnetic radiation with a radiation field being used as the energy source, and at least one of the layers absorbing the electromagnetic radiation and being arranged in the radiation field of the energy source, and arranging a transparent element in the radiation field of the energy source between the energy source and the layer which lies in the radiation field of the energy source and absorbs the specific electromagnetic radiation, and heat treatment of the multilayered element.

In a special configuration, the transparent element absorbs a specific amount of energy and supplies the amount of energy to the layer. In a further configuration, detecting a dimension of a physical parameter of the multilayered element that is dependent on the heat treatment is carried out for controlling the take-up of the amount of energy during the heat treatment and controlling the first and second partial amounts of the amount of energy. In a special configuration, the transparent element supplies the layer with the amount of energy by heat conduction and/or heat radiation.

In a special configuration, a multilayered element with a layer which has copper, indium, gallium and/or selenium is used. In particular, a multilayered element with a supporting layer made of glass and/or metal is used. The supporting layer may, for its part, have a coating (for example a metal layer on a glass plate). A gas which is selected from the group comprising $H_2S$, $H_2Se$, $H_2$, He and $N_2$ is used as the process gas. The method serves in particular for producing a photovoltaic thin-film chalcopyrite absorber of a solar cell and/or of a solar module. In the case of the solar module, there are a multiplicity of individual solar cells connected in series. The glass is preferably soda-lime glass. The corresponding layer acts as a supporting layer. On the supporting layer, a molybdenum layer is applied as an electrode and, over the molybdenum layer, a functional layer is applied, that is a copper-indium-gallium-sulfoselenide (CIGSSe) semiconductor layer. A thickness of the layered element, comprising the glass element and semiconductor layer, is typically 2 to 4 mm, with a molybdenum layer of approximately 0.5 $\mu$m and a semiconductor layer of approximately 3 $\mu$m. The specified range for the thickness of the multilayered element is not to be used exclusively. A limiting factor is a capability for producing a large substrate which is as planar as possible, and consequently can be processed with the described apparatus or with the described method to form a multilayered element. To sum up, the following advantages are obtained with the invention:

- A material being processed can be heat-treated in any desired process-gas atmosphere. In particular, a toxic and/or corrosive process gas can be used. Condensations of a process substance on the chamber walls can be avoided.

- A heating-up and cooling-down profile can be variably set up.

- A material being processed in the form of a multilayered element of a large surface area with an unsymmetrical layer structure (for example a multilayered element with a single layer on a supporting layer) can be heat-treated at a high heat-treating rate of over 1° C./s.

- The layers of the multilayered element may in this case have a greatly differing coefficient of thermal conductivity and/or greatly differing emissivity.

- A temporal and local resolution of the detection and the control of a dimension of a parameter dependent on the heat treatment allows heat treatment to be conducted particularly safely. For example, it is possible to react to a change in a property of the material being processed (for example emissivity or absorptivity) during the heat treatment and set the process parameters (pressure, temperature, energy density, etc.) to it.

Heat treatment to near a softening point of a supporting layer of the material being processed is possible.

In the case of heat treatment beyond the softening point of the supporting layer, a permanent deformation of the multilayered element is possible.

A defined heat-treatment area with a defined process-gas atmosphere can be created. Various process gases with various partial pressure profiles can be set simultaneously or successively before, during and/or after the processing.

All the method steps necessary for the processing can be carried out with a single apparatus.

BRIEF DESCRIPTION OF THE DRAWINGS

An apparatus for heat-treating a material being processed and a corresponding method for this are represented on the basis of several exemplary embodiments and the associated figures. The figures are schematic and do not represent illustrations that are true to scale.

DESCRIPTION OF THE PREFERRED EMBODIMENTS

Figure 1:
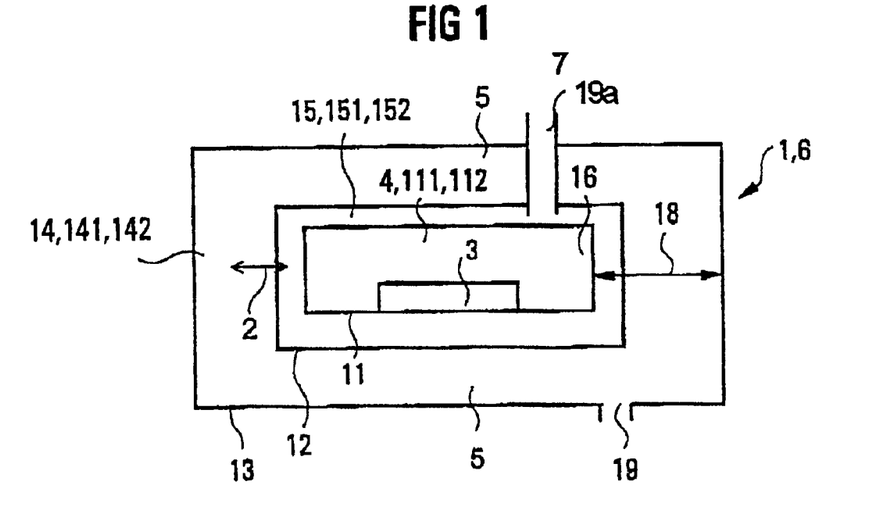
FIG. 1 shows a cross section from the side of an apparatus for heat-treating at least one material being processed.
Figure 3:
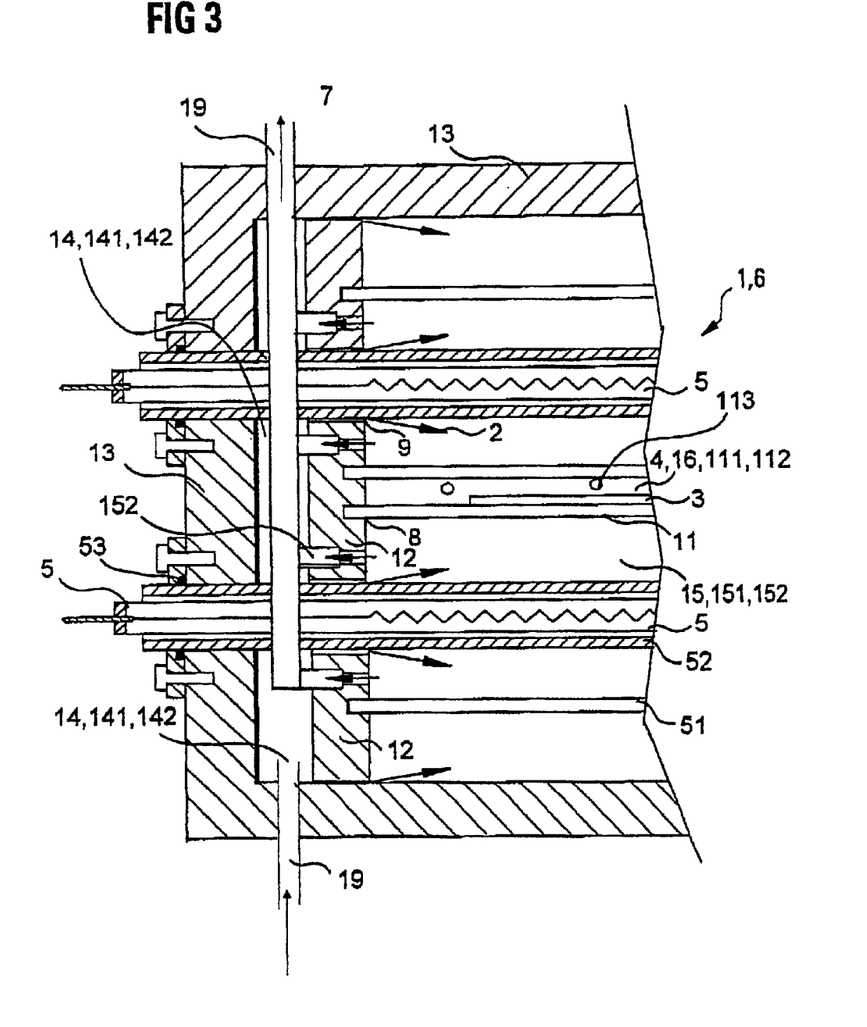
FIG. 3 shows a detail of a cross section from the side of an apparatus for heat-treating at least one material being processed.
Figure 4:
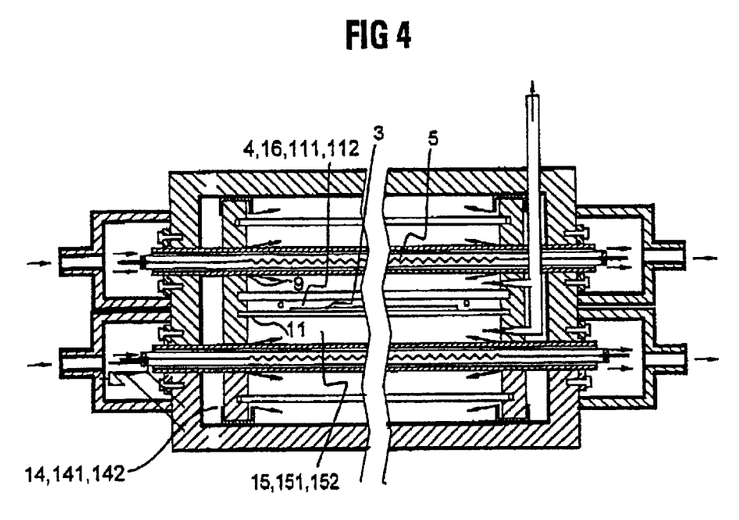
FIG. 4 shows a cross section from the side of an apparatus for heat-treating at least one material being processed.

The starting point is an apparatus 1 for heat-treating a material being processed 3 (FIGS. 1 and 4) under the process-gas atmosphere 111 of a process gas 4. The apparatus 1 has a heat-treatment unit 6 with a heat-treatment container 11, a shroud 12 of the heat-treatment container 11, a heat-treatment chamber 13 and an energy source 5 for the take-up of an amount of energy by the material being processed 3. The heat-treatment container 11 is filled with the process gas 4 via process-gas inlet and outlet openings 113 (FIG. 3). The heat-treatment container 11 lies in a shroud 12, so that there is a buffer space 15 between the shroud 12 and the heat-treatment container 11. Together with the shroud 12, the heat-treatment container is arranged in an evacuable heat-treatment chamber 13, so that there is a distance 18 between the heat-treatment container 11 and the heat-treatment chamber 13. For producing the further gas atmosphere 141 of the intermediate space, there is a closable opening 19 in the heat-treatment chamber 13. A further gas opening is provided in the shroud 12 and is led to the outside by the pipe connection 19a through the heat-treatment chamber 13 to the surrounding area 7.

Figure 2:
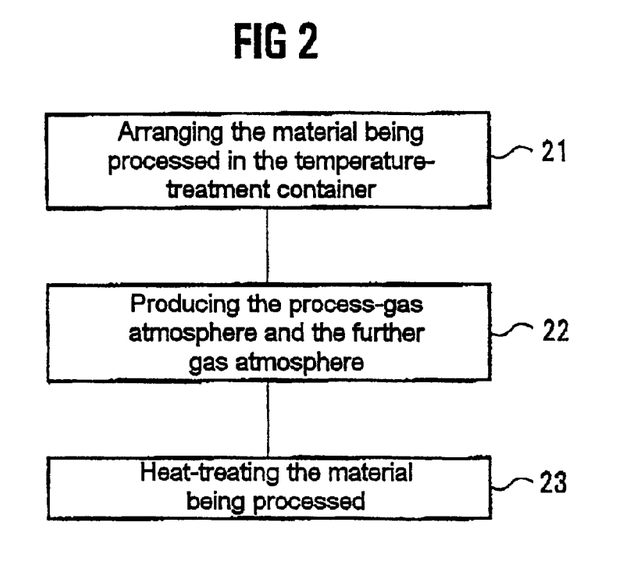
FIG. 2 shows a method of heat-treating at least one material being processed.

The material being processed 3 is arranged in the heat-treatment container 11 in the method step 21 (FIG. 2). After that, the heat treatment (method step 23) takes place, with the pressure gradient 2 being established between the buffer space 15 of the shroud 12 and the intermediate space 14.

In a further embodiment, the pressure gradient 2 is set (method step 22) and, subsequently, the heat treatment 23 is carried out. In this case, a check is kept on the change in the pressure gradient during the heat treatment 23.

FIG. 3 illustrates the principle of gap counterflow purging. The arrows indicate a pressure gradient 2 and a resultant gas stream. During the heat treatment 23, a process-gas atmosphere 111 with the gas pressure 112 of the heat-treatment space 16 prevails in the heat-treatment space 16 of the heat-treatment container 11. The process gas 4 can escape into the buffer space 15 of the heat-treatment unit 6 through a gap 8 of the heat-treatment container 11. To prevent the heat-treatment chamber 13 being contaminated by the process gas 4, the buffer space 15 is connected to a surrounding area 7 in such a way that the gas pressure 152 (gas atmosphere 151) of the buffer space 15 corresponds to a gas pressure of the surrounding area 7. The gas pressure of the surrounding area 7, and consequently the gas pressure 152 of the buffer space 15, is less than the gas pressure 112 of the heat-treatment space 16 and less than the gas pressure 142 of the intermediate space 14.

At the same time, it is ensured that a gas pressure 142 which approximately corresponds to the gas pressure 112 of the heat-treatment space 16 of the heat-treatment container 11 prevails in the intermediate space 14 between the heat-treatment chamber 13 and the heat-treatment container 11. It is slightly greater, so that the process gas 4 does not pass through a gap 9 of the shroud 12 into the intermediate space 14. As a result of the fact that the smaller gas pressure 152, in comparison with the gas pressures 112 and 142, prevails in the surrounding area 7, process gas 4 possibly escaping into the buffer space 15 of the shroud 12 is transported in the direction of the surrounding area 7 on the basis of the prevailing pressure gradient 2.

The embodiment according to FIG. 3 is equipped with additional infrared reflectors 51 and tungsten-halogen bar heating lamps 5, which are inserted in quartz jackets 52. The quartz jackets 52 are led through the vaccuum wall of the heat-treatment chamber 13 and sealed from the atmosphere by vacuum seals 53.

What is claimed is:

1. An apparatus for heat-treating at least one material being processed under a specific process-gas atmosphere of at least one process gas with the aid of a heat-treatment unit, comprising:

a heat-treatment chamber;

a shroud arranged in the heat-treatment chamber so as to define an intermediate space and a buffer space;

a heat-treatment container arranged in the buffer space, said heat-treatment container defining a heat-treatment space for keeping the material being processed under the process-gas atmosphere during the heat treatment;

at least one energy source for making the material being processed take up an amount of energy; and means for producing in the intermediate space a further gas atmosphere of a further gas, different from the process-gas atmosphere, wherein the heat-treatment space, the buffer space and the intermediate space are connected with each other by gaps in such a way that a pressure gradient can be set between the heat-treatment space and the intermediate space.

2. A method for heat-treating a material being processed under a specific process-gas atmosphere of a process gas, with the aid of a heat-treatment apparatus that has a heat-treatment chamber provided with a shroud that defines an intermediate space between the heat-treatment chamber and the shroud, the method comprising the steps of:

arranging the material being processed in a heat-treatment space of a heat-treatment container;

arranging the heat-treatment container in the heat-treatment chamber such that there is a buffer space between the heat-treatment container and the shroud; and heat-treating the material being processed while establishing a pressure gradient between the heat-treatment space and the intermediate space.

3. The method as claimed in claim 2, in which establishing the pressure gradient comprises selecting the pressures in the heat-treatment space, the buffer space and the intermediate space such that the gas pressure in the intermediate space is slightly greater than the gas pressure in the heat-treatment container, and that the gas pressure in the buffer space is smaller than the gas pressure in the heat-treatment space and smaller than the gas pressure in the intermediate space.

4. The method as claimed in claim 2, in which a multilayered element with a layer and at least one further layer is the material being processed.

5. The method as claimed in claim 4, wherein the multilayered element has a layer with at least one of copper, indium, gallium and selenium.

6. The method as claimed in claim 4, wherein the multilayered element has a supporting layer made of glass and/or metal.

7. The method as claimed in claim 2, wherein the process gas is selected from the group comprising $H_2S$, $H_2Se$, $H_2$, He and $N_2$.

8. The method as claimed in claim 2, wherein a further gas which is selected from the group comprising $N_2$ and/or noble gas is used.

9. The method as claimed in claim 2 for producing a photovoltaic thin-film chalcopyrite absorber of a solar cell and/or a solar module.

10. The method as claimed in claim 5, wherein the multilayered element has a supporting layer made of glass and/or metal.

11. The method as claimed in claim 3, wherein the process gas is selected from the group comprising $H_2S$, $H_2Se$, $H_2$, He and $N_2$.

12. The method as claimed in claim 3, wherein a further gas which is selected from the group comprising $N_2$ and/or noble gas is used.

13. The method as claimed in claim 3 for producing a photovoltaic thin-film chalcopyrite absorber of a solar cell and/or a solar module.

* * * * *